(12) United States Patent
Nakatsuka et al.

(10) Patent No.: US 7,986,198 B2
(45) Date of Patent: Jul. 26, 2011

(54) FREQUENCY-VARIABLE ACOUSTIC THIN FILM RESONATOR, FILTER AND COMMUNICATION APPARATUS USING THE SAME

(75) Inventors: Hiroshi Nakatsuka, Osaka (JP); Takehiko Yamakawa, Osaka (JP); Keiji Onishi, Osaka (JP)

(73) Assignee: Panasonic Corporation, Osaka (JP)

( * ) Notice: Subject to any disclaimer, the term of this patent is extended or adjusted under 35 U.S.C. 154(b) by 327 days.

(21) Appl. No.: 12/375,313

(22) PCT Filed: Aug. 1, 2007

(86) PCT No.: PCT/JP2007/065058
§ 371 (c)(1),
(2), (4) Date: Jan. 27, 2009

(87) PCT Pub. No.: WO2008/016075
PCT Pub. Date: Feb. 7, 2008

(65) Prior Publication Data
US 2009/0273416 A1 Nov. 5, 2009

(30) Foreign Application Priority Data

Aug. 3, 2006 (JP) ................................ 2006-212353

(51) Int. Cl.
*H03H 9/70* (2006.01)
*H03H 9/54* (2006.01)
*H03H 9/15* (2006.01)
(52) U.S. Cl. ........ 333/133; 333/188; 333/189; 310/322; 310/366
(58) Field of Classification Search .......... 333/187–189, 333/133; 310/321–323, 328, 334, 366
See application file for complete search history.

(56) References Cited

U.S. PATENT DOCUMENTS
3,047,823 A * 7/1962 Ranky ............................ 333/188
(Continued)

FOREIGN PATENT DOCUMENTS
JP 2-199994 * 8/1990
(Continued)

OTHER PUBLICATIONS

Kulkarni et al.; "andwidth Improvement Methods In Acoustically-Coupled thin Film BAW Devices"; 2006 IEEE International Frequency Control Symposium and Exposition; Miami, FL, Jun. 2006, pp. 165-171.*

(Continued)

*Primary Examiner* — Barbara Summons
(74) *Attorney, Agent, or Firm* — Hamre, Schumann, Mueller & Larson, P.C.

(57) ABSTRACT

An acoustic thin film resonator including: a first piezoelectric thin film 101; a pair of primary electrodes 103 and 104 for applying an electric signal, which are formed on the first piezoelectric thin film; a second piezoelectric thin film 102 that is disposed so that an oscillation generated in the first piezoelectric thin film propagates to the second piezoelectric thin film; a pair of secondary electrodes 104 and 105 for outputting an electric signal, which are formed on the second piezoelectric thin film; a load 108 that is connected between the secondary electrodes; and a control portion 109 that controls a value of the load. Thereby, an acoustic thin film resonator element is formed so that an electric signal inputted from the primary electrodes is outputted from the secondary electrodes by a piezoelectric effect, and a resonant frequency and an antiresonant frequency are made variable through the control of the value of the load. A resonant frequency and an antiresonant frequency are made variable at the same time without resonant characteristics being deteriorated.

14 Claims, 15 Drawing Sheets

U.S. PATENT DOCUMENTS

| | | | |
|---|---|---|---|
| 4,320,365 A * | 3/1982 | Black et al. | 333/187 |
| 5,216,392 A * | 6/1993 | Fraser et al. | 333/17.3 |
| 5,291,159 A * | 3/1994 | Vale | 333/188 |
| 5,294,898 A * | 3/1994 | Dworsky et al. | 333/187 |
| 5,382,930 A * | 1/1995 | Stokes et al. | 333/191 |
| 5,446,306 A | 8/1995 | Stokes et al. | |
| 5,910,756 A | 6/1999 | Ella | |
| 6,060,818 A | 5/2000 | Ruby et al. | |
| 6,204,737 B1 | 3/2001 | Ellä | |
| 6,710,681 B2 * | 3/2004 | Figueredo et al. | 333/187 |
| 6,720,844 B1 * | 4/2004 | Lakin | 333/189 |
| 6,943,484 B2 * | 9/2005 | Clark et al. | 310/334 |
| 7,030,718 B1 * | 4/2006 | Scherer | 333/188 |
| 7,098,758 B2 * | 8/2006 | Wang et al. | 333/189 |
| 7,719,389 B2 * | 5/2010 | Ito et al. | 333/188 |
| 2002/0175781 A1 | 11/2002 | Wunnicke et al. | |
| 2004/0014249 A1 * | 1/2004 | Jorgenson et al. | 438/5 |
| 2004/0212277 A1 | 10/2004 | Stommer | |
| 2005/0174198 A1 * | 8/2005 | Razafimandimby et al. | 333/188 |
| 2008/0024244 A1 * | 1/2008 | Cathelin et al. | 333/190 |

FOREIGN PATENT DOCUMENTS

| | | |
|---|---|---|
| JP | 7-203593 A | 8/1995 |
| JP | 11-88111 A | 3/1999 |
| JP | 2000-30595 | 1/2000 |
| JP | 2000-69594 | 3/2000 |
| JP | 2002-372974 | 12/2002 |
| JP | 2004-525577 A | 8/2004 |
| JP | 2004-534473 A | 11/2004 |
| JP | 2005-109573 A | 4/2005 |

OTHER PUBLICATIONS

Lakin et al.; "Stacked Crystal Filters Implemented With Thin Films"; IEEE 43rd Annual Symposium on Frequency Control; Denver, CO, May 31-Jun. 2, 1989, pp. 536-543.*

Lakin et al.; "Modeling of Thin Film Resonators and Filters"; 1992 IEEE International Microwave Symposium Digest; Albuquerque, NM, Jun. 1-5, 1992, pp. 149-152.*

Kulkarni et al.; "Control of Electromechanical Coupling in Stacked Crystal Filters"; 2006 IEEE Systems, Applications and Technology Conference; Long Island, NY, May 5, 2006, pp. 1-7.*

* cited by examiner

FREQUENCY-VARIABLE ACOUSTIC THIN FILM RESONATOR, FILTER AND COMMUNICATION APPARATUS USING THE SAME

TECHNICAL FIELD

The present invention relates to a frequency-variable acoustic thin film resonator that can suppress the generation of a spurious signal, and a filter using the same.

BACKGROUND ART

There has been a demand for further size and weight reductions of components to be incorporated in electronic equipment such as mobile equipment. For example, a filter used in mobile equipment is requested to be reduced in size and also to be variable in central frequency and frequency band. As one type of filters that meet these requirements, a filter using an acoustic thin film resonator has been known (see Patent Documents 1 to 2).

First, with reference to FIG. 17, the following describes a conventional acoustic thin film resonator described in Patent Document 1.

FIG. 17 shows a cross-sectional structure of an acoustic thin film resonator. This acoustic thin film resonator has a structure in which a piezoelectric body 2 and semiconductor layers 1 and 3 that are provided respectively on both surfaces of the piezoelectric body 2 are sandwiched between an upper electrode E2 and a lower electrode E1. This structure is supported on a substrate S via an acoustic mirror layer AS. The acoustic mirror layer AS is formed of a combination of materials that have a large difference in acoustic impedance. In this acoustic thin film resonator, an electric field is applied in a thickness direction by the upper electrode E2 and the lower electrode E1, and thus an oscillation occurs in the thickness direction. At this time, nearly 100% of sound waves are reflected by the acoustic mirror layer AS, so that the oscillation is concentrated in an area defined by the piezoelectric body 2, the semiconductor layers 1 and 3, the upper electrode E2, and the lower electrode E1.

The description is directed next to the principle of an operation of allowing this acoustic thin film resonator to have a variable frequency.

When a voltage is applied to the upper electrode E2 and the lower electrode E1, a diffusion voltage Vd that is generated by the diffusion of electric charge is amplified or attenuated. This causes the thickness of an active layer obtained by the application of an external voltage to be varied. With respect to longitudinal waves, the active layer behaves differently from the semiconductor layers, so that the resonant frequency of the acoustic thin film resonator varies with the thickness of the active layer.

Next, with reference to FIGS. 18, 19A and 19B, the following describes a conventional acoustic thin film resonator described in Patent Document 2.

FIG. 18 shows a cross-sectional structure of an acoustic thin film resonator. This acoustic thin film resonator has a structure in which a piezoelectric body 13 is sandwiched between an electrode 10 and an electrode 11, and a dielectric layer 14 whose dielectric constant varies depending on an applied direct current voltage and an electrode 12 further are formed below the electrode 11. The dielectric layer 14 and the electrode 12 form a variable capacitance CT. For use, this acoustic thin film resonator is mounted on a substrate 17 in which a cavity 16 is formed. In order to provide the cavity 16, for example, using a microfabrication method, the substrate 17 is etched partially from its rear surface so that a thin plate portion 15 is formed. An electric field is applied in a thickness direction of the piezoelectric body 13 by the electrode 10 and the electrode 11, and thus an oscillation occurs in the thickness direction.

FIGS. 19A and 19B show equivalent circuits of this acoustic thin film resonator. A thin film bulk acoustic wave resonator element 18 can be represented by an equivalent circuit that is constituted of a circuit in which a capacitance C1, an inductor L1, and a resistance R1 are connected in series, and a capacitance C0 that is connected in parallel with this circuit. A variable capacitance element 19 can be represented by an equivalent circuit that is constituted of a variable capacitance CT. Depending on how a connection is made, the variable capacitance element 19 and the thin film bulk acoustic wave resonator element 18 may have a configuration shown in FIG. 19A in which they are connected in series, or a configuration shown in FIG. 19B in which they are connected in parallel.

A direct current voltage is applied between the electrode 12 and the electrode 11 shown in FIG. 18 so as to cause the dielectric constant of the dielectric layer 14 to vary, and thus the resonant frequency of the acoustic thin film resonator can be made variable.

Patent Document 1: JP 2004-534473 A
Patent Document 2: JP 2005-109573 A

DISCLOSURE OF INVENTION

Problem to be Solved by the Invention

The acoustic thin film resonator described in Patent Document 1 uses a structure in which the electrode size is made variable using a DC bias and thus requires a circuit for applying a DC to the resonator so as to control the frequency, resulting in a complicated circuit configuration. Further, in order to allow the resonant frequency to be variable, as a constituent material of the acoustic thin film resonator, a material other than a piezoelectric body also is required to be included between the electrodes, leading to an increase in loss.

Furthermore, in the acoustic thin film resonator described in Patent Document 2, a variable capacitor is added in series or in parallel with the acoustic thin film resonator element. Therefore, when the capacitor is connected in series with the acoustic thin film resonator element, the difference between the resonant frequency and antiresonant frequency of the acoustic thin film resonator becomes small, resulting in deterioration of the filter characteristics. Further, when the capacitor is connected in parallel with the acoustic thin film resonator element, the loss of the capacitor has a significant influence on the characteristics of the acoustic thin film resonator. Further, in the configuration of Patent Document 2, while the resonant frequency and antiresonant frequency of the acoustic thin film resonator can be made variable individually, it is impossible to allow them to vary at the same time.

With the foregoing in mind, it is an object of the present invention to provide an acoustic thin film resonator and a filter, in which a resonant frequency and an antiresonant frequency can be made variable at the same time without resonant characteristics of the acoustic thin film resonator being deteriorated.

Means for Solving Problem

In order to achieve the above-described object, a frequency-variable acoustic thin film resonator according to the present invention includes: a first piezoelectric thin film; a pair of primary electrodes for applying an electric signal, which are formed on the first piezoelectric thin film; a second piezoelectric thin film that is disposed so that an oscillation generated in the first piezoelectric thin film propagates to the second piezoelectric thin film; a pair of secondary electrodes for outputting an electric signal, which are formed on the second piezoelectric thin film; a load that is connected between the secondary electrodes; and a control portion that controls a value of the load. Thereby, an acoustic thin film resonator element is formed so that an electric signal inputted from the primary electrodes is outputted from the secondary electrodes by a piezoelectric effect, and a resonant frequency and an antiresonant frequency are made variable through the control of the value of the load.

Effects of the Invention

According to a frequency-variable acoustic thin film resonator having the above-described configuration, a resonant frequency and an antiresonant frequency can be made variable at the same time. Thus, it is possible to realize a low-loss and wideband frequency-variable acoustic thin film resonator, filter, and communication apparatus.

Figure 1A:
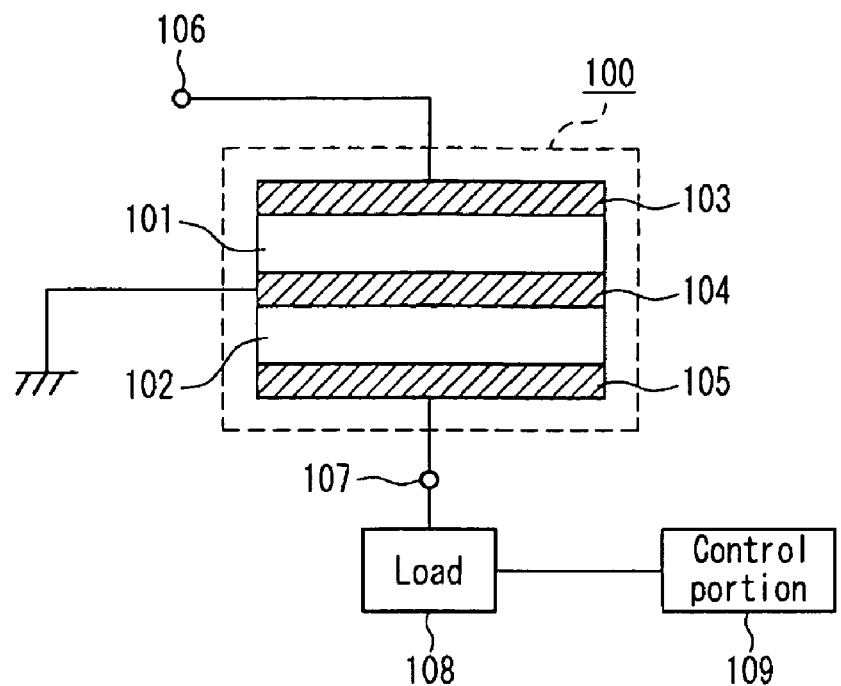
FIG. 1A is a block diagram showing a frequency-variable acoustic thin film resonator according to Embodiment 1 of the present invention.

EXPLANATION OF LETTERS OR NUMERALS 1, 3 semiconductor layer
2, 13 piezoelectric body
10, 11, 12 electrode
14 dielectric layer
15 thin plate portion
16 cavity
17 substrate
18 thin film bulk acoustic wave resonator element
19 variable capacitance element
100, 110, 120, 200, 300, 310, 400, 410 acoustic thin film resonator element
101, 102, 131, 141 piezoelectric body
103, 132, 142 first electrode
104, 134, 144 second electrode
105, 133, 143 third electrode
106, 301a, 401a input terminal
107, 301b, 401b output terminal
108, 123, 302, 402a, 402b load
109, 112, 114, 124, 202, 204, 303 control portion
111 variable capacitance
113 variable inductor
121, 135, 145 substrate
122, 136, 146 cavity
201, 201a, 201b, 201c switch element
203a to 203c loads A to C
304 inductor
403a control portion A
403b control portion B
501 phase shifter
502 transmitting filter
503 receiving filter
601 antenna
602 duplexer
603 low-noise amplifier
604 base band portion
605 power amplifier
AS acoustic mirror layer
CT variable capacitance E2 upper electrode
E1 lower electrode
S substrate

DESCRIPTION OF THE INVENTION

Based on the above-described configuration, the frequency-variable acoustic thin film resonator according to the present invention can assume the following various embodiments.

That is, preferably, the load is formed of a variable capacitance. Desirably, the load is set to have a value variable in a range between 1/100 times and 100 times a value of a secondary capacitance of the acoustic thin film resonator element. More preferably, the load is set to have a value variable in a range between 1/10 times and 10 times the value of the secondary capacitance.

Furthermore, the load may be formed of a variable inductor. Desirably, the variable inductor is set to have an impedance variable in a range between 1/100 times and 100 times a value of a secondary impedance of the acoustic thin film resonator element. More preferably, the variable inductor is set to have an impedance variable in a range between 1/10 times and 10 times the value of the secondary impedance.

Furthermore, the load may be formed of a switch element. In the case of a switch element, the load easily can be made variable between infinity and zero.

Furthermore, the load also can be formed of a combination of a plurality of switch elements, capacitances, inductors and the like. In this case, switching of the load is achieved by switching between ON/OFF states and thus can be facilitated.

Furthermore, the frequency-variable acoustic thin film resonator according to the present invention can be configured as follows. That is, the first piezoelectric thin film and the second piezoelectric thin film are disposed in a laminated state, and between the first piezoelectric thin film and the second piezoelectric thin film, a second electrode is provided so as to be shared by both of the piezoelectric thin films. A first electrode is provided on a surface of the first piezoelectric thin film on a side opposite the second electrode. A third electrode is provided on a surface of the second piezoelectric thin film on a side opposite the second electrode. The first and second electrodes function as the primary electrodes, and the second and third electrodes function as the secondary electrodes.

In this configuration, preferably, where a total of film thicknesses of the first and second electrodes and the first piezoelectric thin film is defined as a film thickness P, and a sum of the film thickness P and thicknesses of the second piezoelectric thin film and the third electrode is defined as an entire film thickness T, a film thickness ratio P/T is set to be in a range of values larger than a value at which a resonator element constituted of the first and second electrodes and the first piezoelectric film has a maximum effective coupling coefficient and smaller than a value at which a resonator element constituted of the second and third electrodes and the second piezoelectric film has a maximum effective coupling coefficient.

Furthermore, preferably, the first piezoelectric thin film and the second piezoelectric thin film are made of AlN, and the first to third electrodes are made of Mo. In this configuration, where a total of thicknesses of the first and second electrodes and the first piezoelectric thin film is defined as a film thickness P, and a sum of the film thickness P and thicknesses of the second piezoelectric thin film and the third electrode is defined as an entire film thickness T, a film thickness ratio P/T is set to be in a range of 0.4 to 0.5.

Furthermore, preferably, the first piezoelectric thin film and the second piezoelectric thin film are made of AlN, and the first to third electrodes are made of Mo. In this configuration, where a total of thicknesses of the first and second electrodes and the first piezoelectric thin film is defined as a film thickness P, and a sum of the film thickness P and thicknesses of the second piezoelectric thin film and the third electrode is defined as an entire film thickness T, a film thickness ratio P/T is set to be not higher than 0.58.

In an alternative possible configuration, the first piezoelectric thin film and the second piezoelectric thin film are formed integrally. In that case, one of the primary electrodes and one of the secondary electrodes can be formed in common.

When used alone, each of the above-described acoustic resonators according to the present invention functions as a filter, and also when any of the acoustic resonators are connected in combination, a filter having various frequency characteristics can be obtained. Further, it also is possible to use the above-described filters to constitute a transmitting filter and a receiving filter so as to be used as a duplexer, and the above-described filters further can be used in a communication apparatus.

Hereinafter, embodiments of the present invention will be described in detail with reference to the appended drawings.

Embodiment 1

Figure 1B:
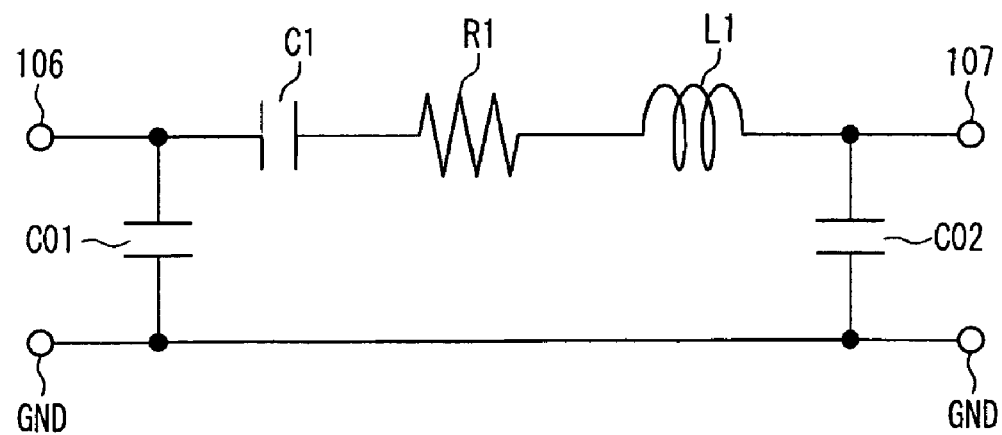
FIG. 1B is an equivalent circuit diagram of the frequency-variable acoustic thin film resonator.

FIG. 1A is a block diagram of a frequency-variable acoustic thin film resonator according to Embodiment 1 of the present invention. FIG. 1B is an equivalent circuit diagram thereof.

In FIG. 1A, an acoustic thin film resonator element 100 has a first piezoelectric body 101 and a second piezoelectric body 102 that are disposed in a laminated state. The first piezoelectric body 101 is sandwiched between a first electrode 103 and a second electrode 104, and the second piezoelectric body 102 is sandwiched between the second electrode 104 and a third electrode 105. An input terminal 106 is connected to the first electrode 103, the second electrode 104 is connected to GND, and an output terminal 107 is connected to the third electrode 105. A load 108 also is connected to the third electrode 105, and the value of the load 108 is controlled by a control portion 109.

As shown in FIG. 1B, the acoustic thin film resonator element 100 can be represented by an equivalent circuit that is constituted of a circuit in which a capacitance C1, a resistance R1, and an inductor L1 are connected in series, and capacitances C01 and C02 are connected in parallel with this circuit.

In the above-described configuration, when an electric signal is applied via the input terminal 106 to the first electrode 103, a longitudinal oscillation in a thickness direction is excited in a portion defined by the first piezoelectric body 101 by electrical/mechanical conversion. The excited oscillation propagates to the second piezoelectric body 102 and is outputted as an electric signal from the output terminal 107 via the third electrode 105. An oscillation used at this time is an oscillation in the form of standing waves such that an antinode of the oscillation is formed on each of a principal surface opposite a principal surface at which the first electrode 103 is in contact with the first piezoelectric body 101 and a principal surface opposite a principal surface at which the third electrode 105 is in contact with the second piezoelectric body 102.

In the frequency-variable acoustic thin film resonator according to this embodiment, the load 108 is provided and controlled, and thus the following features are exhibited.

That is, the value of the load 108 is varied so as to exert an influence on an oscillation that propagates through the acoustic thin film resonator element 100, so that a resonant frequency and an antiresonant frequency are shifted at the same time. This is caused by the following operation. That is, in the acoustic thin film resonator in which an oscillation occurs in the form of standing waves, an oscillation excited in the first piezoelectric body 101 propagates to the second piezoelectric body 102 and is converted therein into an electric signal (electric charge) by a piezoelectric effect. The electric charge obtained by the conversion is taken out from the second electrode 104 and the third electrode 105. However, in this embodiment, since the second electrode 104 is used as a ground, the electric charge is outputted from the third electrode 105.

In a state where the load 108 has a value that approximates to infinity, electric charge generated in the third electrode 105 does not flow to the load 108 but is converted back into an oscillation in the second piezoelectric body 102. A resonant frequency obtained at this time is equal to a resonant frequency obtained in the case where the load 108 is not connected.

Furthermore, in a state where the load 108 has a value that approximates to zero, electric charge generated in the third electrode 105 flows into the load 108. As a result, an influence is exerted on an operation of the acoustic thin film resonator element 100 to an extent determined by an amount of electric charge as part of electric charge generated in the third electrode 105 that flows to the load 108, so that the resonant frequency varies. At this time, the resonant frequency is shifted to a low frequency side.

Furthermore, in the case where the load 108 is set to have an arbitrarily variable value, an amount of electric charge as part of electric charge generated in the third electrode 105 that flows to the load 108 varies, and thus the resonant frequency can be made arbitrarily variable. At this time, the resonant frequency has a value between a resonant frequency obtained in the case where the load is infinite and a resonant frequency obtained in the case where the load is zero.

Figure 2:
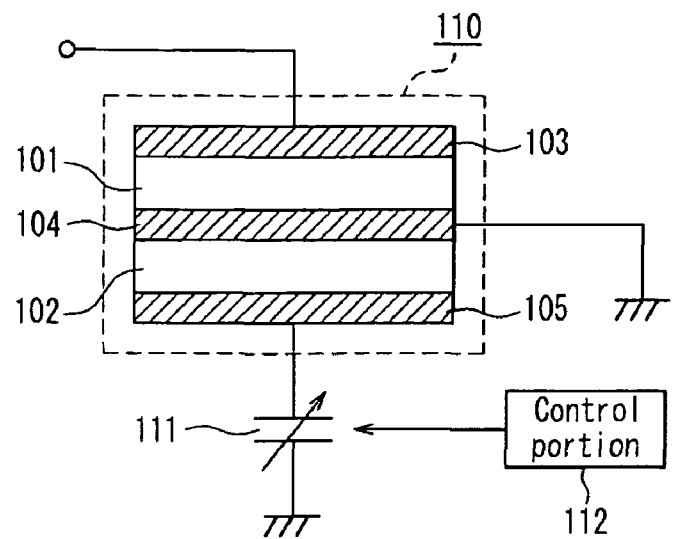
FIG. 2 is a block diagram showing another example of the frequency-variable acoustic thin film resonator according to Embodiment 1 of the present invention.

FIG. 2 shows a frequency-variable acoustic thin film resonator as a working example in which as the load 108 shown in FIG. 1A, a variable capacitance 111 is connected to an acoustic thin film resonator element having a configuration similar to the configuration shown in FIG. 1A, and a capacitance value thereof is controlled by a control portion 112. The variable capacitance 111 is used as a load, and thus between the variable capacitance 111 and a third electrode 105, electric charge generated in a third electrode 105 is received/transmitted as a reactive power. This can reduce loss.

Figure 3:
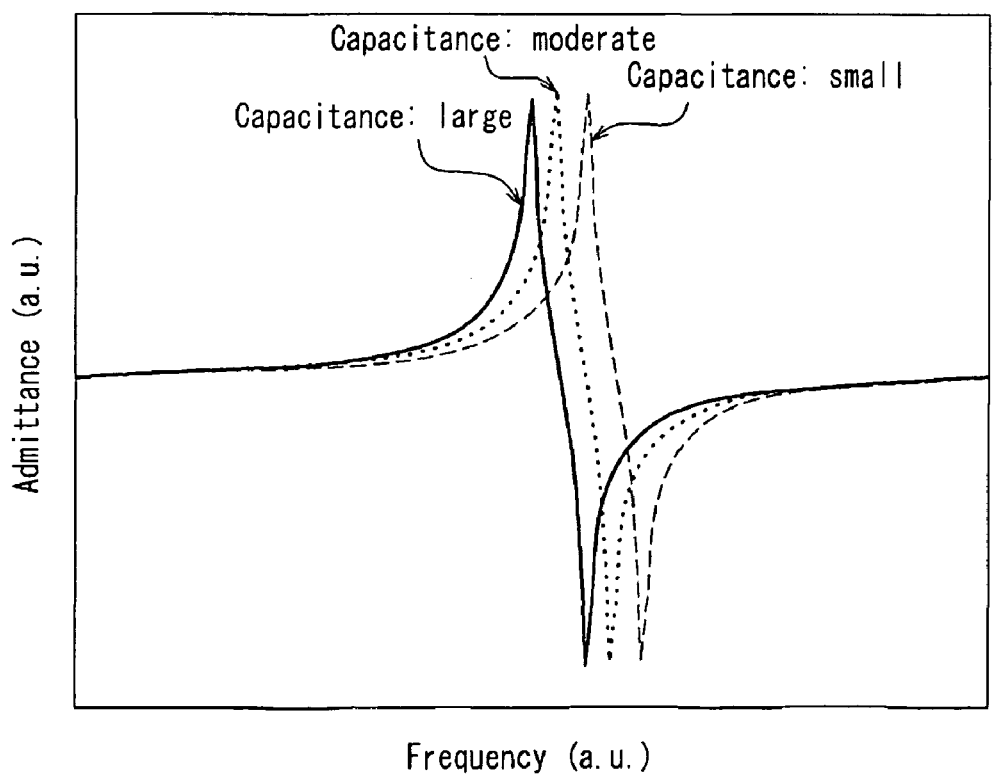
FIG. 3 is a diagram explaining a frequency shift with respect to a capacitance change in the frequency-variable acoustic thin film resonator shown in FIG. 2.

FIG. 3 is a diagram showing frequency characteristics of admittance obtained in the case where the value of the variable capacitance 111 is varied. When a capacitance value of the variable capacitance 111 is small, the resonant frequency lies in the vicinity of a resonant frequency obtained in the case where the load is infinite (high frequency side), and when the capacitance value is increased, the resonant frequency is shifted to the vicinity of a resonant frequency obtained in the case where the load is zero (low frequency side).

Figure 4:
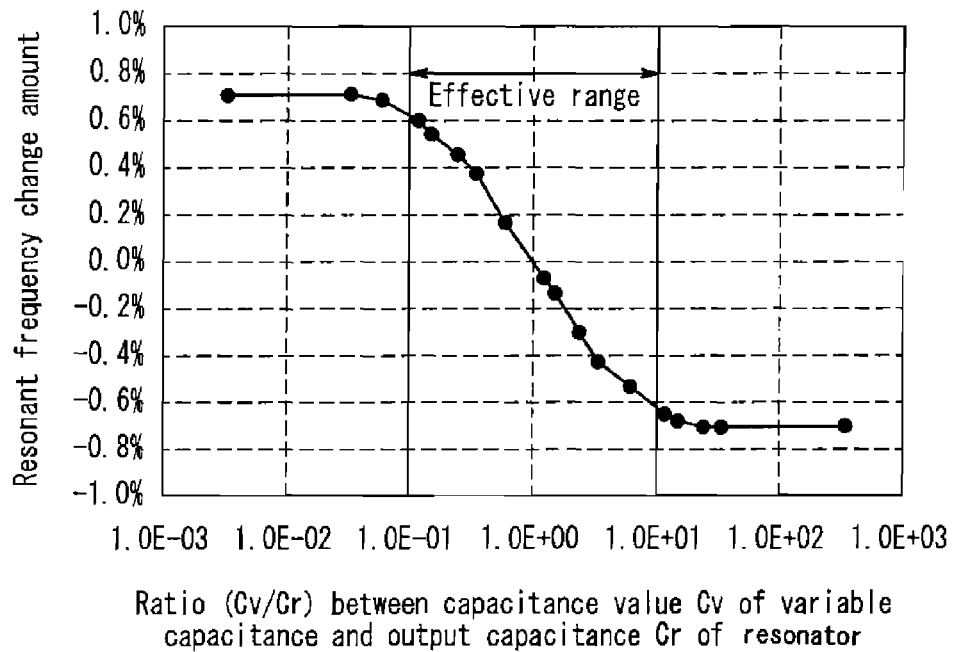
FIG. 4 is a diagram explaining a frequency change amount with respect to a capacitance change in the frequency-variable acoustic thin film resonator shown in FIG. 2.

FIG. 4 shows a change amount of the resonant frequency with respect to a ratio Cv/Cr between a capacitance value Cv of the variable capacitance 111 and an output capacitance Cr of the acoustic thin film resonator element 110. In the case where the capacitance ratio Cv/Cr has a value in the vicinity of 1, a frequency change amount with respect to a load fluctuation is large, and when the capacitance ratio Cv/Cr has a value in a range deviating therefrom, a change amount of the resonant frequency is small. When the capacitance value Cv of the variable capacitance 111 is made variable in a range of the capacitance ratio Cv/Cr between 0.01 and 100, a frequency variation width can be varied in a range from the vicinity of a resonant frequency at the load of an infinite value to the vicinity of a resonant frequency at the load of zero.

Moreover, when the capacitance value Cv is made variable in a range of the capacitance ratio Cv/Cr in the vicinity of 0.1 to 10, it is possible to obtain a frequency-variable acoustic thin film resonator that exhibits a large frequency change amount with respect to a small load fluctuation.

Figure 5:
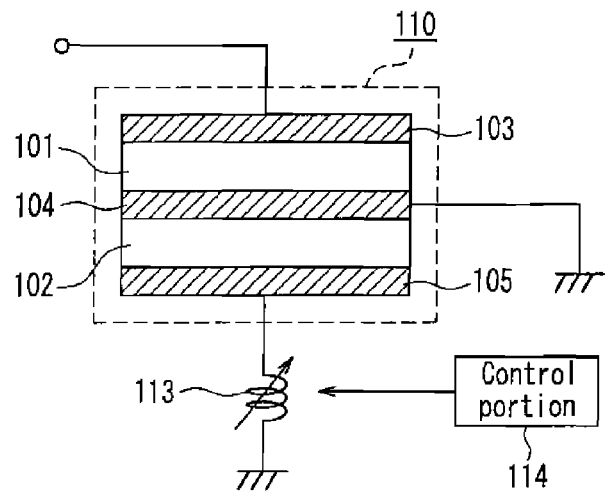
FIG. 5 is a block diagram showing still another example of the frequency-variable acoustic thin film resonator according to Embodiment 1 of the present invention.

A similar effect can be obtained also by using a variable inductor 113 as a load as shown in FIG. 5 in place of the working example shown in FIG. 2 in which the variable capacitance 111 is used as a load. An impedance value of the variable inductor 113 is controlled by a control portion 114 so that resonant and antiresonant frequencies of an acoustic thin film resonator element 110 are made variable.

Figure 6:
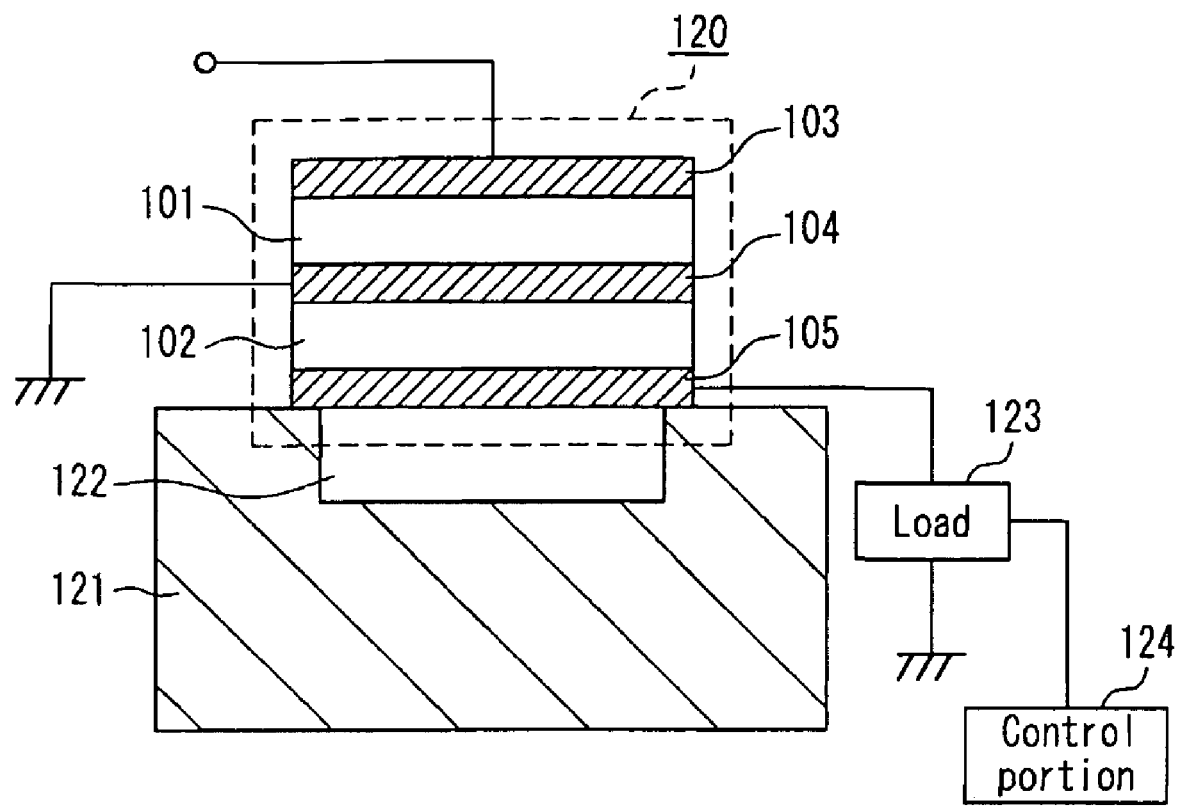
FIG. 6 is a block diagram showing an example in which the frequency-variable acoustic thin film resonator according to Embodiment 1 of the present invention is provided with a substrate.

Furthermore, a similar effect can be obtained also by a configuration in which an acoustic thin film resonator element 120 is supported by a substrate 121 as shown in FIG. 6 in place of the above-described examples in which the acoustic thin film resonator element 100 or 110 is provided alone. A cavity 122 for securing an oscillation is provided in the substrate 121. A third electrode 105 is connected to a load 123, and the load 123 is controlled by a control portion 124 so that resonant and antiresonant frequencies of the acoustic thin film resonator element 120 are made variable.

Figure 7A:
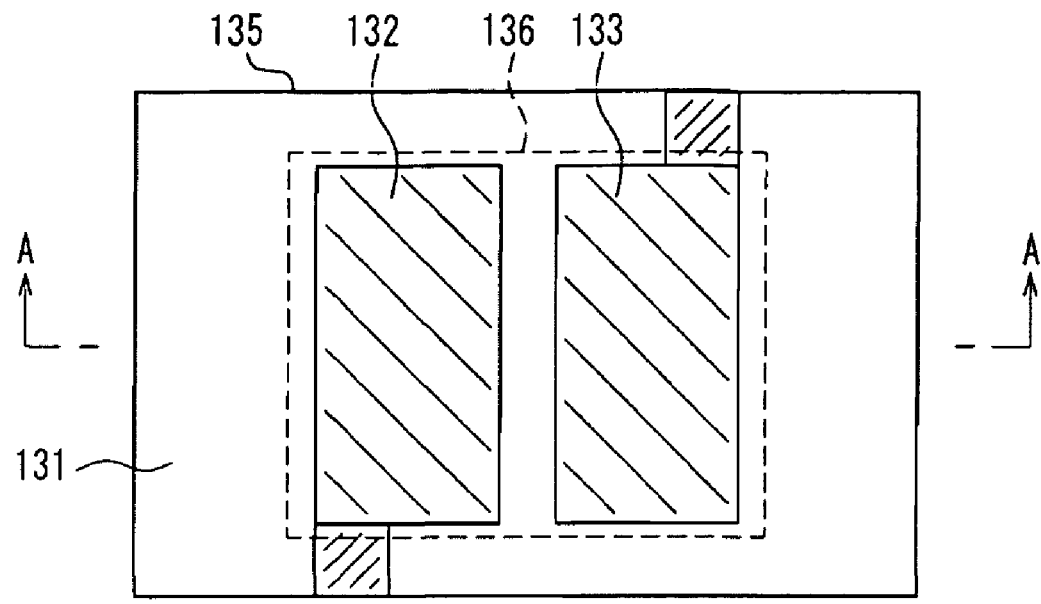
FIG. 7A is a plan view showing a surface shape of yet another example of the acoustic thin film resonator according to Embodiment 1 of the present invention.
Figure 7B:
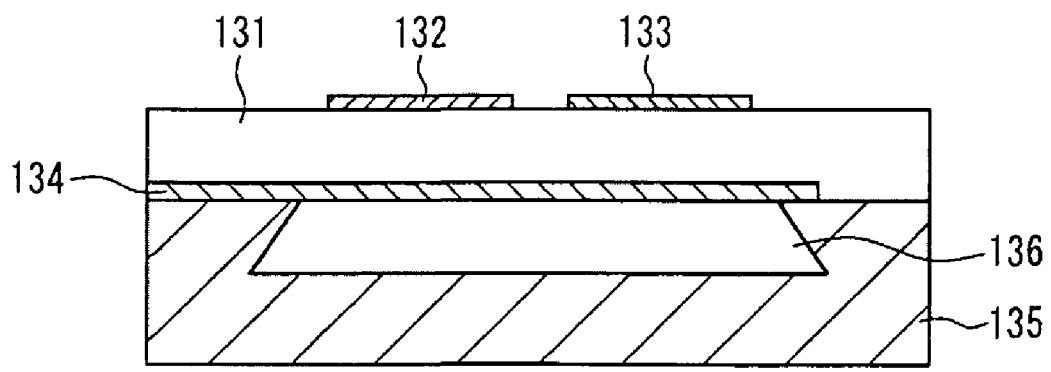
FIG. 7B is a cross-sectional view of the acoustic thin film resonator, which is taken along line A-A.
Figure 8A:
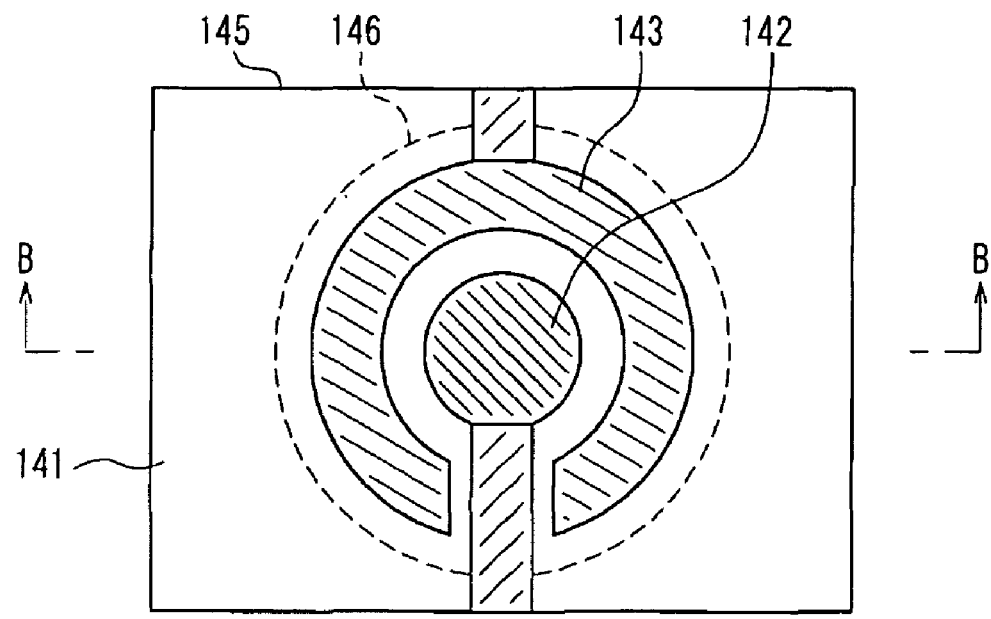
FIG. 8A is a plan view showing a surface shape of yet another example of the acoustic thin film resonator according to Embodiment 1 of the present invention.
Figure 8B:
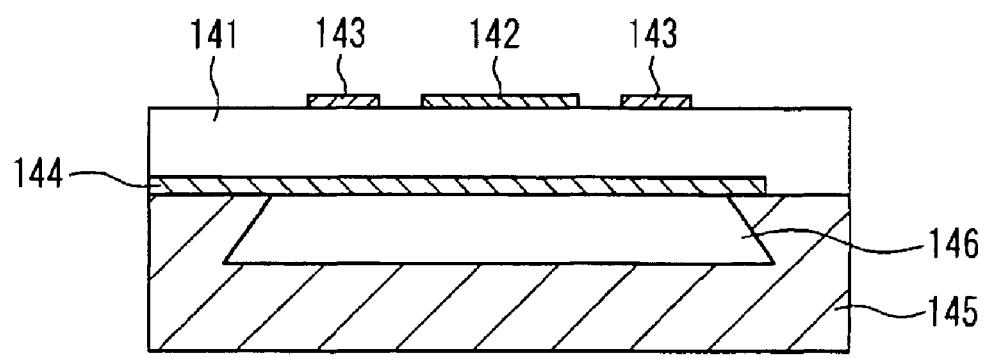
FIG. 8B is a cross-sectional view of the acoustic thin film resonator, which is taken along line B-B.

Moreover, in addition to the structure shown in FIG. 1A, the acoustic thin film resonator element 100 may have a structure shown in FIGS. 7A and 7B or a structure shown in FIGS. 8A and 8B.

FIGS. 7A and 7B show a working example of an acoustic thin film resonator element using oscillations in a thickness direction that are coupled laterally. FIG. 7A is a plan view, and FIG. 7B is a cross-sectional view taken along line A-A of FIG. 7A. On one surface of a piezoelectric body 131, a first electrode 132 and a third electrode 133 are provided, and on the other surface thereof, a second electrode 134 is provided. This configuration provides a lateral arrangement of a structure in which the piezoelectric body 131 is sandwiched between the first electrode 132 and the second electrode 134 and a structure in which the piezoelectric body 131 is sandwiched between the second electrode 134 and the third electrode 133. This acoustic thin film resonator element is disposed on a cavity 136 formed in a substrate 135.

FIGS. 8A and 8B show a working example of an acoustic thin film resonator element in which oscillations are coupled laterally as in the configuration shown in FIGS. 7A and 7B, with electrodes arranged concentrically. FIG. 8A is a plan view, and FIG. 8B is a cross-sectional view taken along line B-B of FIG. 8A. On one surface of a piezoelectric body 141, a ring-shaped third electrode 143 is provided concentrically around a first electrode 142 formed in a circular shape. On the other surface of the piezoelectric body 141, a second electrode 144 is provided so that the piezoelectric body 141 is sandwiched between the first electrode 142 and the second electrode 144. This acoustic thin film resonator element is disposed on a cavity 146 formed in a substrate 145. According to the structure shown in FIGS. 8A and 8B, the degree of coupling can be improved compared with the acoustic thin film resonator element having the structure shown in FIGS. 7A and 7B, and wideband and low-loss characteristics can be obtained.

Furthermore, although this embodiment is explained with the examples in which a variable capacitance or a variable inductor is used as a load, a similar effect can be obtained also in the case where a variable resistance is used as a load. In that case, electric charge generated in a third electrode is consumed by the load. Because of this, under a condition that impedance matching is established with an output capacitance of an acoustic thin film resonator, a Q value of a frequency-variable acoustic thin film resonator may be degraded, for example, and thus it is desirable to use the load at an impedance outside a range of such a condition.

Embodiment 2

Figure 9:
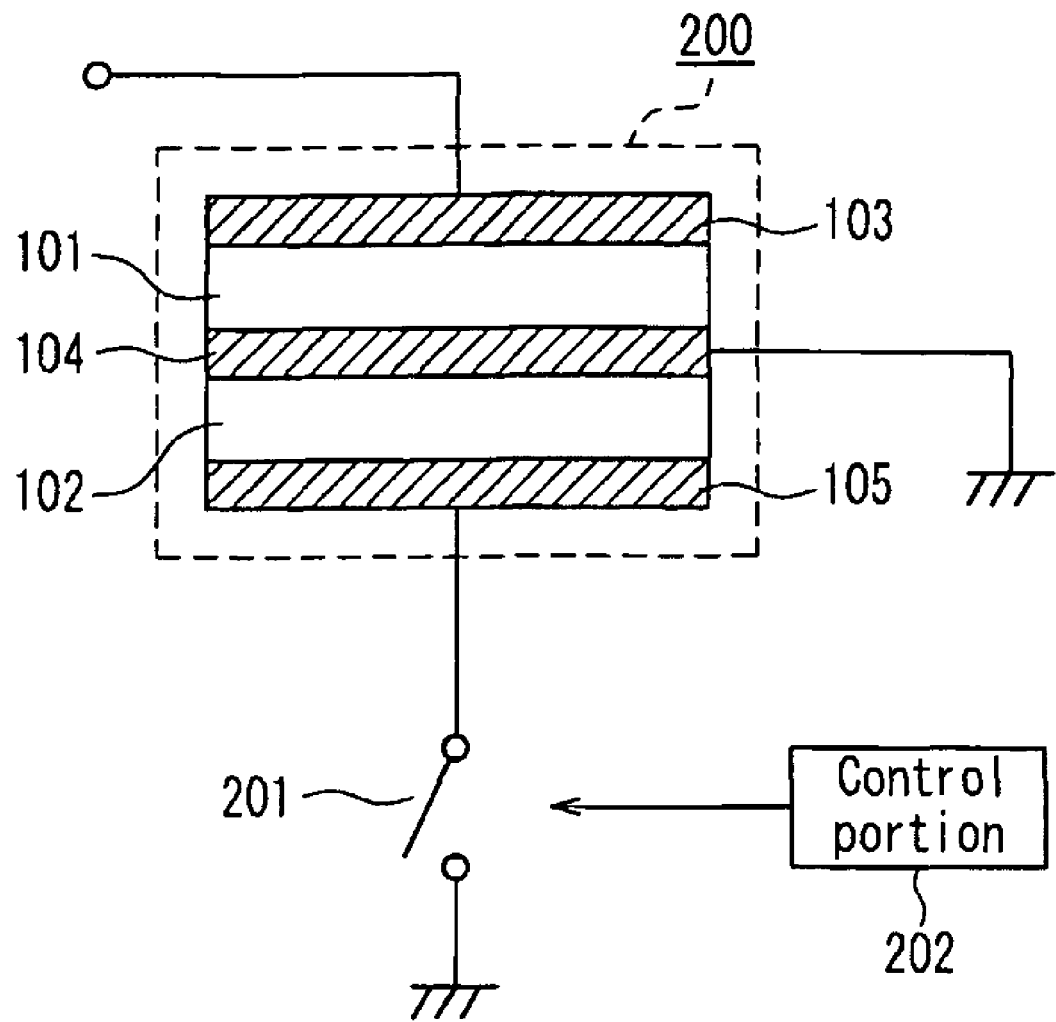
FIG. 9 is a block diagram showing a frequency-variable acoustic thin film resonator according to Embodiment 2 of the present invention.

FIG. 9 is a block diagram of a frequency-variable acoustic thin film resonator according to Embodiment 2 of the present invention. This embodiment is different from Embodiment 1 in that a switch element 201 is provided in place of the load 108 shown in FIG. 1A, and a control portion 202 that controls the switch element 201 is provided.

Aside from that, the structure and operation of an acoustic thin film resonator element 200 are the same as those of the acoustic thin film resonator element 100 of Embodiment 1, and therefore, similar elements are denoted by the same reference characters as in Embodiment 1, for which duplicate descriptions are omitted.

In the frequency-variable acoustic thin film resonator according to this embodiment with the above-described configuration, the following features are exhibited with the switch element 201.

First, by using the switch element 201 that can operate in an open state and a short-circuited state as a load, so as to make the load to be variable between binary values of ON/OFF states, a variable frequency can be realized easily.

Figure 10:
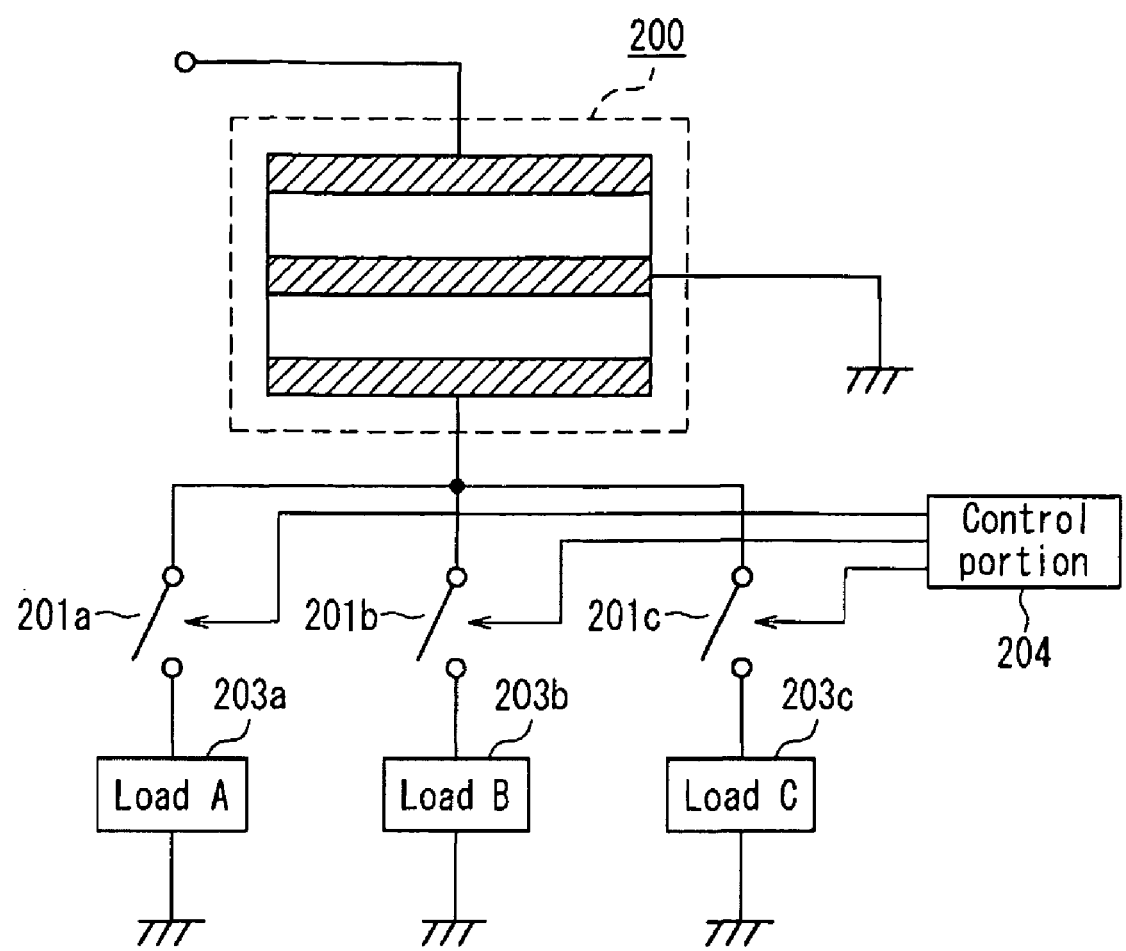
FIG. 10 is a block diagram showing another example of the frequency-variable acoustic thin film resonator according to Embodiment 2 of the present invention.

Furthermore, as shown in FIG. 10, it also is possible to provide a plurality of switch elements 201a, 201b, and 201c and a load A203a, a load B203b, and a load C203c that are connected respectively to the switch elements 201a, 201b, and 201c, and to perform switching of the switch elements 201a, 201b, and 201c by a control portion 204, thereby allowing a frequency to be variable. In this case, a variable frequency can be achieved simply by controlling the ON/OFF states of each of the switch elements 201a, 201b, and 201c with respect to a desired frequency change amount, and the control can be simplified since it only requires the ON/OFF states to be controlled, thus obtaining a significant practical effect.

Embodiment 3

Figure 11:
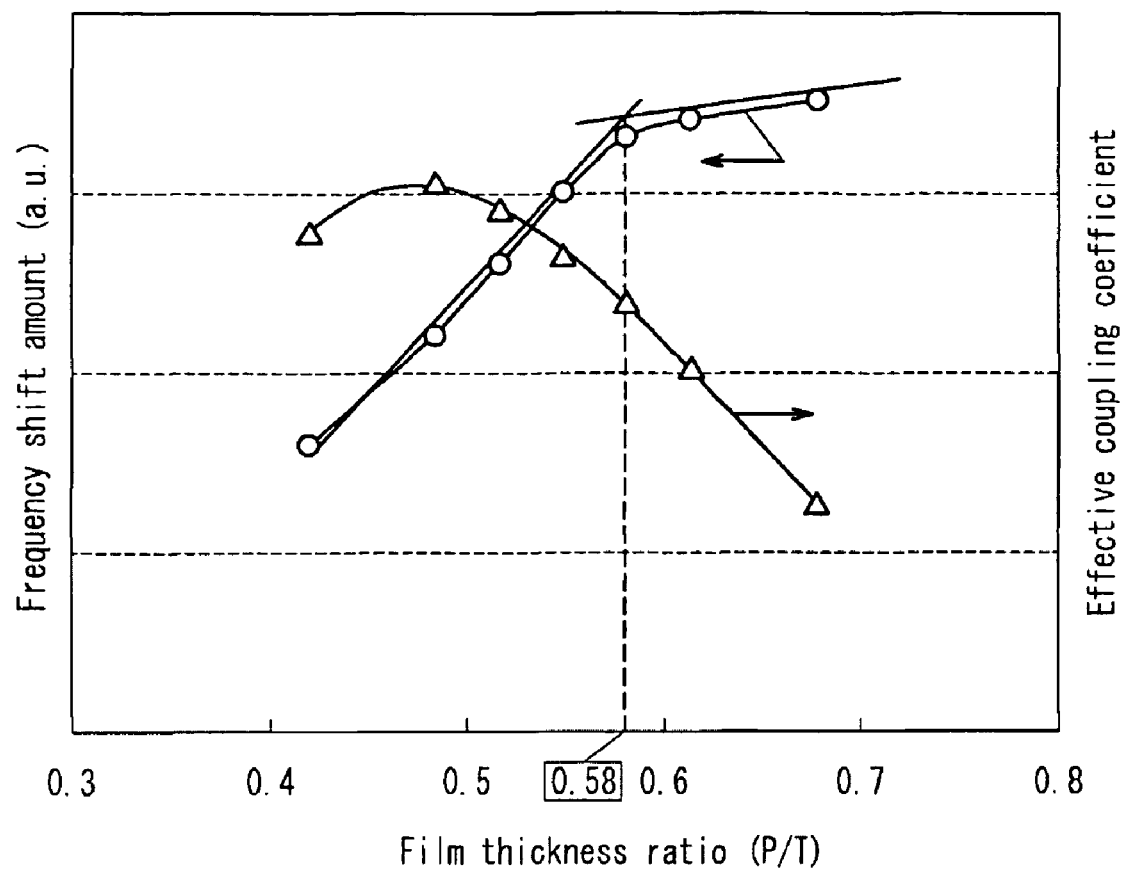
FIG. 11 is a diagram showing characteristics of a frequency-variable acoustic thin film resonator according to Embodiment 3 of the present invention.

The following describes a frequency-variable acoustic thin film resonator according to Embodiment 3 with reference to FIG. 11 that shows a change in characteristics with respect to a change in film thickness of piezoelectric bodies and electrodes. A frequency-variable acoustic thin film resonator element described in this embodiment has a basic structure similar to the structure shown in FIG. 1A, in which a first piezoelectric body and a second piezoelectric body are disposed in a laminated state.

FIG. 11 shows characteristics as results obtained by calculation with respect to a case where in the structure of the frequency-variable acoustic thin film resonator shown in Embodiment 1 (FIG. 1A), Mo is used as an electrode material and the electrodes are set to have a fixed thickness, while AlN is used as a piezoelectric material and the first piezoelectric body 101 and the second piezoelectric body 102 are set to have a varying film thickness.

In FIG. 11, the horizontal axis indicates a film thickness ratio P/T where a film thickness P represents a total of thicknesses of the first electrode 103, the second electrode 104, and the first piezoelectric body 101, and T represents an entire film thickness. The entire film thickness T is a sum of the film thickness P and thicknesses of the second piezoelectric body 102 and the third electrode 105. In FIG. 11, a circle mark (○) indicates a frequency shift amount. The frequency shift amount is defined as a magnitude of a frequency shift that occurs with respect to a per-unit change in value of the load 108 in the configuration shown in FIG. 1A. Further, a triangle mark (Δ) indicates an effective coupling coefficient of the resonator as seen from the first electrode 103, the second electrode 104, and the first piezoelectric body 101.

When the thickness ratio P/T is increased by increasing the thickness of the first piezoelectric body 101, the frequency shift amount increases. However, the rate of increase thereof decreases after reaching its peak at a value of the film thickness ratio P/T in the vicinity of 0.58. Meanwhile, the effective coupling coefficient exhibits a tendency that it has a maximum value at a value of the film thickness ratio P/T in a range of 0.4 to 0.5, and at a value of the film thickness ratio P/T exceeding 0.5, it decreases with increasing value of the film thickness ratio P/T. Therefore, increasing the film thickness ratio P/T to a value larger than 0.58 merely ends up in obtaining a small increase in the frequency shift amount and causing degradation of characteristics as a resonator.

Meanwhile, when the first piezoelectric body 101 and the second piezoelectric body 102 have the same film thickness, an oscillation distribution is obtained such that an antinode of an oscillation is observed at each of upper and lower surfaces and at a position of the second electrode 104. At this time, as the thickness of the first piezoelectric body 101 is increased, the oscillation distribution turns into one in which an antinode of an oscillation falls at a position inside the first piezoelectric body 101. As a result, due to the oscillation, cancellation of electric charge occurs inside the piezoelectric body, bringing about a situation where an inputted electric energy is not converted effectively into an oscillation, so that the effective coupling coefficient decreases. On the other hand, when the first piezoelectric body 101 is made thin, an antinode of an oscillation moves towards the second piezoelectric body 102, and thus canceling of electric charge does not occur inside the piezoelectric body, so that the effective coupling coefficient increases. However, when the first piezoelectric body 101 is made thinner, the second piezoelectric body 102 and the third electrode 105 act as a mechanical load during an oscillation, leading to a decrease in effective coupling coefficient.

Furthermore, the frequency shift amount is influenced by characteristics of a resonator element constituted of the second piezoelectric body 102. As the film thickness ratio P/T is decreased so that the frequency is shifted by an amount determined by the effective coupling coefficient of the resonator element constituted of the second electrode 104, the second piezoelectric body 102, and the third electrode 105, the frequency shift amount decreases. On the other hand, as the film thickness ratio P/T is increased, the frequency shift amount increases. However, when the film thickness ratio P/T is increased to a value exceeding a specific value, the effective coupling coefficient reaches its saturation, so that the change amount decreases. In the case of this embodiment, this happens when the film thickness ratio P/T is 0.58, and thus it is desirable to have a configuration in which the film thickness ratio P/T is set to a value in a range smaller than 0.58. According to this configuration, it is possible to obtain a sufficient action of achieving a variable frequency while maintaining characteristics as a resonator (effective coupling coefficient).

That is, when the film thickness is set to be in such a range that the film thickness ratio P/T is larger than a value at which a resonator element constituted of the first and second electrodes 103 and 104 and the first piezoelectric body 101 has a maximum effective coupling coefficient and smaller than a value at which the resonator element constituted of the second and third electrodes 104 and 105 and the second piezoelectric body 102 has a maximum effective coupling coefficient, it is possible to obtain a frequency-variable acoustic thin film resonator that has a large effective coupling coefficient and achieves a large frequency shift amount.

Embodiment 4

Figure 12:
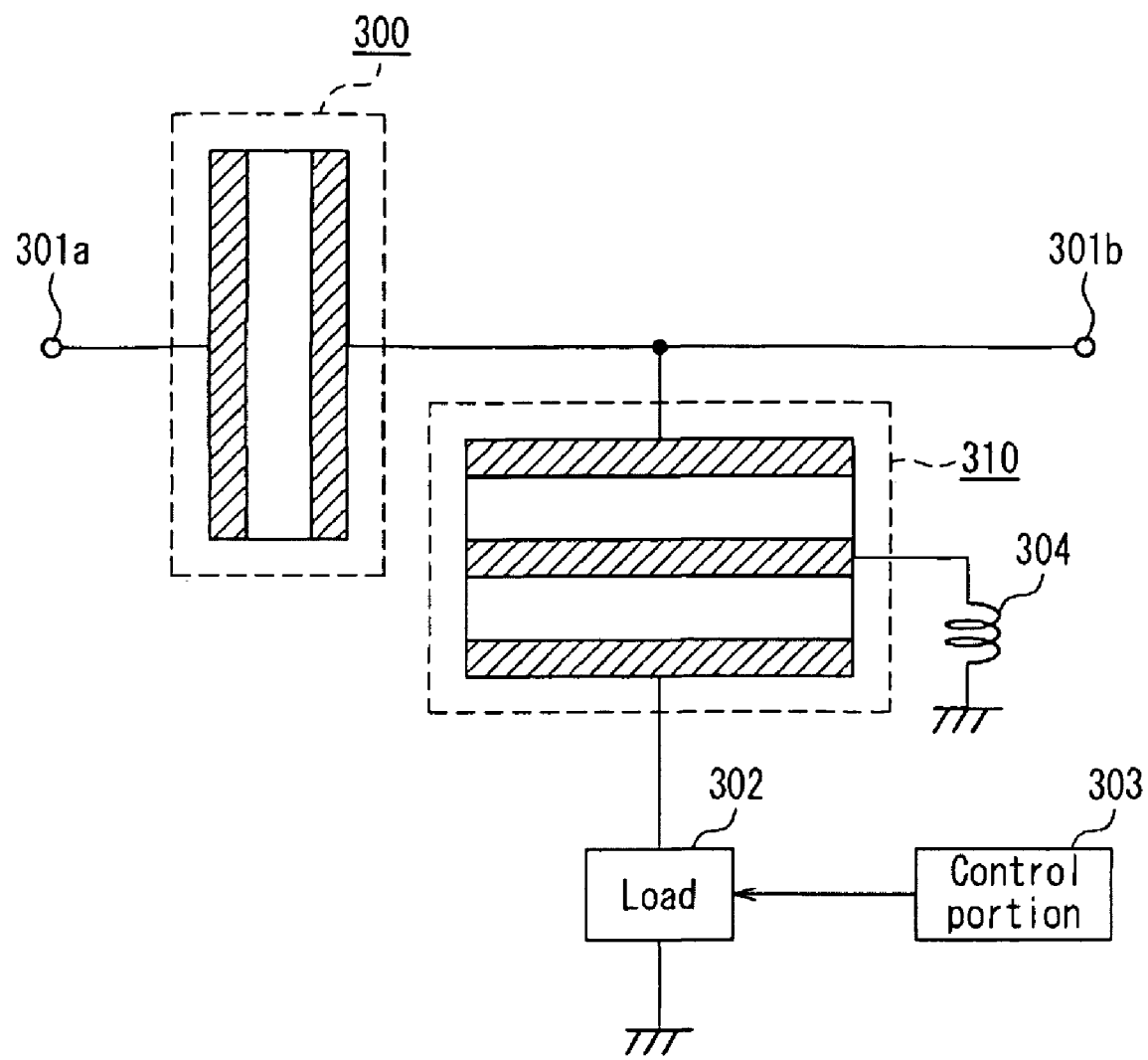
FIG. 12 is a block diagram showing a filter according to Embodiment 4 of the present invention.

FIG. 12 is a diagram showing an example of a configuration of a filter according to Embodiment 4, which uses the frequency-variable acoustic thin film resonator according to the present invention. This filter is a ladder filter in which acoustic thin film resonator elements are connected in an L shape. An acoustic thin film resonator element 300 is connected so as to operate as a series resonator. That is, the resonator element 300 is connected in series between an input terminal 301a and an output terminal 301b. A frequency-variable acoustic thin film resonator element 310 is connected so as to operate as a parallel resonator. That is, the resonator element 310 is connected between a path extending from the input terminal 301a to the output terminal 301b and a ground potential. Herein, when the resonant frequency of the acoustic thin film resonator element 300 is set to a value higher than the resonant frequency of the acoustic thin film resonator element 310, a ladder filter having bandpass characteristics can be obtained.

The acoustic thin film resonator element 310 shown in FIG. 12 performs the same operation as that of the acoustic thin film resonator shown in Embodiment 1 or 2, and the value of a load 302 is controlled by a control portion 303, thereby allowing resonant and antiresonant frequencies to be variable. Further, in the configuration shown in FIG. 12, the acoustic resonator element 310 is grounded via an inductor 304. According to this configuration, the inductor 304 allows an amount of attenuation at an out-of-band frequency to be maintained or an attenuation pole to be controlled, thereby providing a considerable effect from the viewpoint of usage.

Figure 13:
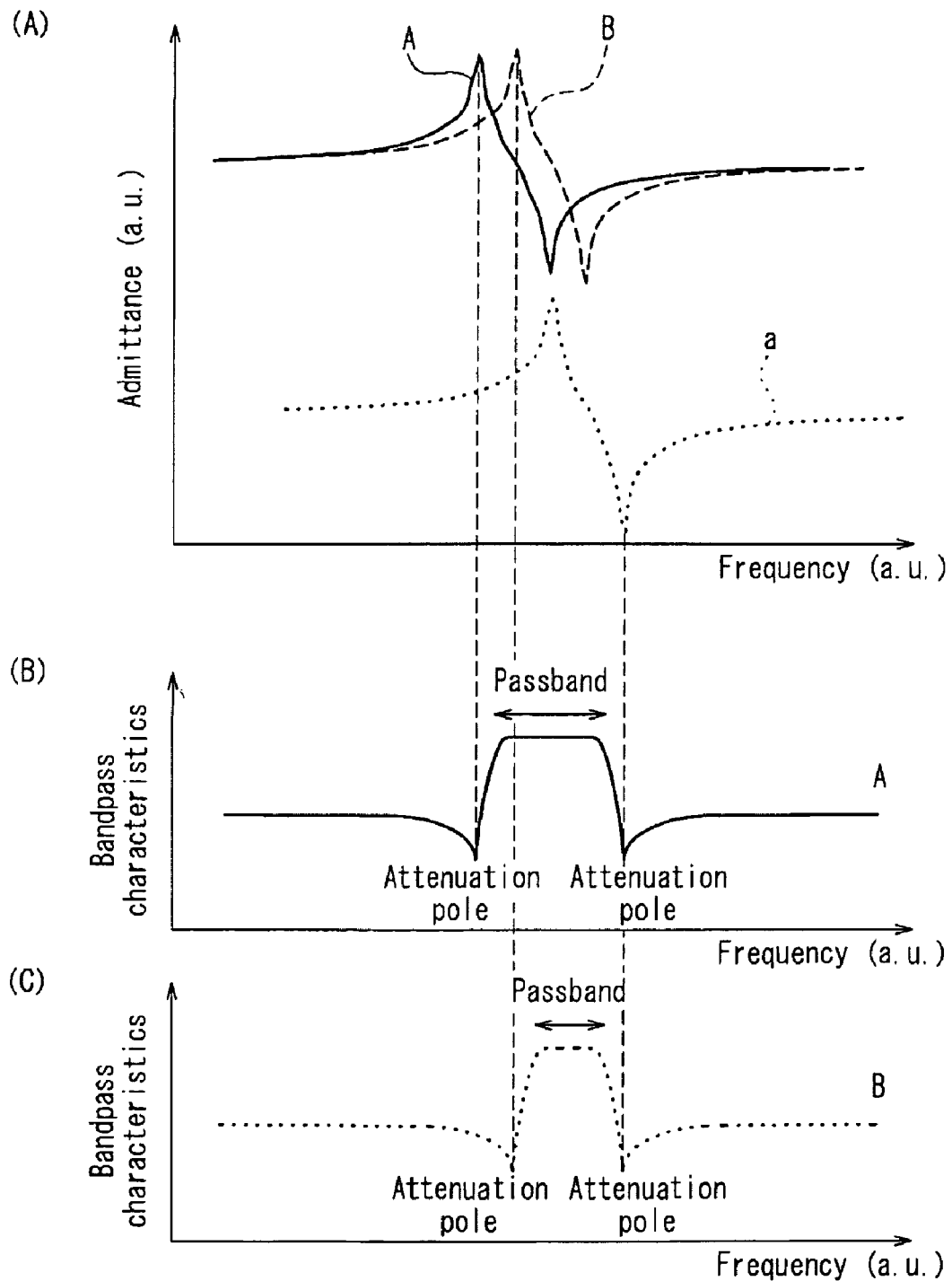
FIG. 13 is a diagram explaining an operation of the filter shown in FIG. 12.

With reference to FIG. 13, the description is directed next to an operation of the circuit shown in FIG. 12. FIG. 13(A) is a diagram showing frequency characteristics of admittance of the acoustic thin film resonator element 300 and the acoustic thin film resonator element 310 (frequency-variable acoustic thin film resonator constituted of this resonator element and the load 302). A characteristic "a" represents characteristics of the acoustic thin film resonator element 300. The frequency characteristics of admittance of the acoustic thin film resonator element 310 are made variable by varying the value of the load 302. A characteristic "A" represents characteristics of the acoustic thin film resonator element 310 in the case where the load 302 is heavy. A characteristic "B" represents characteristics of the acoustic thin film resonator element 310 in the case where the load 302 is light.

When a comparison is made between the characteristic "A" and the characteristic "B", an interval between the resonant and antiresonant frequencies is nearly constant. FIG. 13(B) shows bandpass characteristics of the filter when having the frequency characteristic "A" of admittance shown in FIG. 13(A). FIG. 13(C) shows bandpass characteristics of the filter when having the frequency characteristic "B" of admittance.

With reference to FIGS. 13(A) and 13(B), it is shown that in the state where the load 302 of the acoustic thin film resonator element 310 is heavy, the resonant frequency and the antiresonant frequency are shifted to a low frequency side. Meanwhile, the frequency characteristics of admittance of the acoustic thin film resonator element 300 remain constant. As a result, wideband bandpass characteristics as shown in FIG. 13(B) can be obtained.

On the other hand, with reference to FIGS. 13(A) and 13(C), it is shown that in the state where the load 302 of the acoustic thin film resonator element 310 is light, the resonant frequency and the antiresonant frequency are shifted to a high frequency side. Meanwhile, the frequency characteristics of admittance of the acoustic thin film resonator element 300 remain constant. As a result, bandbass characteristics with a narrow passband width as shown in FIG. 13(C) are obtained.

The load 302 is controlled in the above-described manner, and thus it is possible to allow a passband width to be variable.

Although this embodiment showed the filter having an L-shaped configuration as an example, it also is possible to form a filter in which filters having an L-shaped configuration are connected in multiple stages.

Embodiment 5

Figure 14:
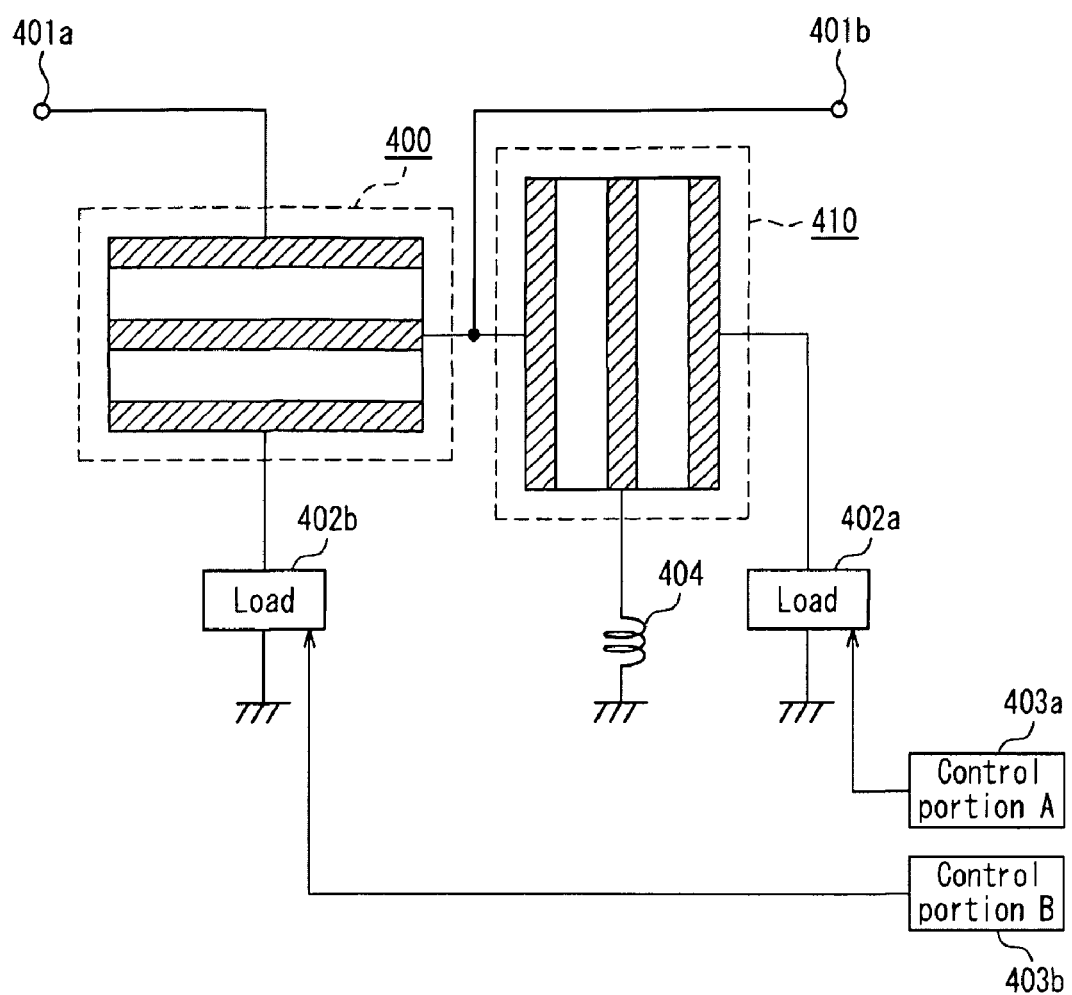
FIG. 14 is a block diagram showing a filter according to Embodiment 5 of the present invention.

FIG. 14 is a diagram showing an example of a configuration of a filter according to Embodiment 5, which uses the frequency-variable acoustic thin film resonator according to the present invention. This filter is a ladder filter in which frequency-variable acoustic thin film resonators are connected in an L shape. An acoustic thin film resonator element 400 is connected so as to operate as a series resonator. That is, the resonator element 400 is connected in series between an input terminal 401a and an output terminal 401b. An acoustic thin film resonator element 410 is connected so as to operate as a parallel resonator. That is, the resonator element 410 is connected between a path extending from the input terminal 401a to the output terminal 401b and a ground potential. Herein, when the resonant frequency of the acoustic thin film resonator element 400 is set to a value higher than the resonant frequency of the acoustic thin film resonator element 410, a ladder filter having bandbass characteristics can be obtained.

The acoustic thin film resonator elements 400 and 410 shown in FIG. 14 operate in a similar manner to that of the acoustic thin film resonator shown in Embodiment 1 or Embodiment 2, and the values of loads 402a and 402b are controlled by a control portion A 403a and a control portion B 403b, thereby allowing resonant and antiresonant frequencies to variable. Further, the acoustic thin film resonator element 410 is grounded via an inductor 404. According to this configuration, the inductor 404 allows an amount of attenuation at an out-of-band frequency to be maintained or an attenuation pole to be controlled, thereby providing a significant practical effect.

In FIG. 14, this embodiment is different from Embodiment 4 in that the acoustic thin film resonator element 400 connected in series also is configured similarly to the acoustic thin film resonator elements shown in Embodiments 1 and 2.

In the filter configured as above, the resonant and antiresonant frequencies of both of the acoustic thin film resonator element 400 connected in series and the acoustic thin film resonator element 410 connected in parallel are variable. That is, the loads 402a and 402b are made variable, so that not only a bandwidth but also a central frequency (intermediate frequency between attenuation poles) can be made variable, thereby providing an extremely considerable effect from the viewpoint of usage.

Although this embodiment explained the filter having an L-shaped configuration as an example, a similar effect can be obtained also by filters having other configurations such as a T-shaped configuration, a π-shaped configuration, and a lattice-shaped configuration. Further, it is also possible to connect filters having a L-shaped configuration in multiple stages.

Embodiment 6

Figure 15:
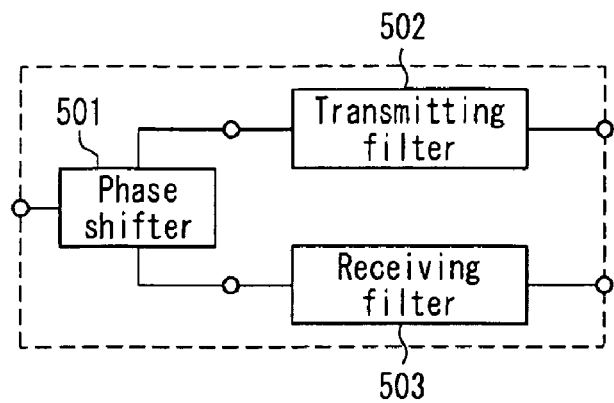
FIG. 15 is a block diagram showing a duplexer according to Embodiment 6 of the present invention.

FIG. 15 is a block diagram showing a configuration of a duplexer according to Embodiment 6. This duplexer has a configuration in which a transmitting filter 502 and a receiving filter 503 are connected to a phase shifter 501. The transmitting filter 502 and the receiving filter 503 are formed of any of the frequency-variable acoustic thin film resonators according to Embodiments 1 and 2 or any of the filters according to Embodiments 4 and 5.

According to this configuration, a frequency-variable duplexer can be obtained. Such a frequency-variable duplexer functions not only as a duplexer (filter) with respect to a single system but also as a duplexer (filter) adaptable to a plurality of systems when used in a manner that frequency change is performed, thereby providing a considerable effect from the viewpoint of miniaturizing a filter portion. Further, the control of the phase shifter is performed integrally with the control of a bandwidth and a central frequency of the filter, and thus a low-loss duplexer can be realized.

Although this embodiment shows an example of a duplexer composed of a phase shifter, a transmitting filter, and a receiving filter, needless to say, a similar effect can be obtained also in the cases where the frequency-variable acoustic thin film resonators or filters according to the above-described embodiments are used in other configurations.

Embodiment 7

Figure 16:
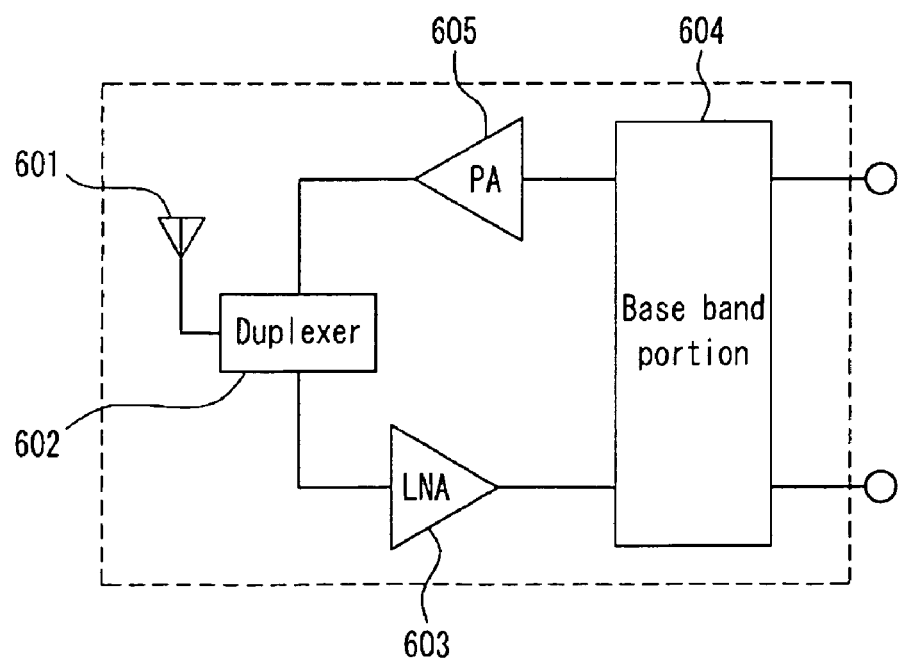
FIG. 16 is a block diagram showing a communication apparatus according to Embodiment 7 of the present invention.
Figure 17:
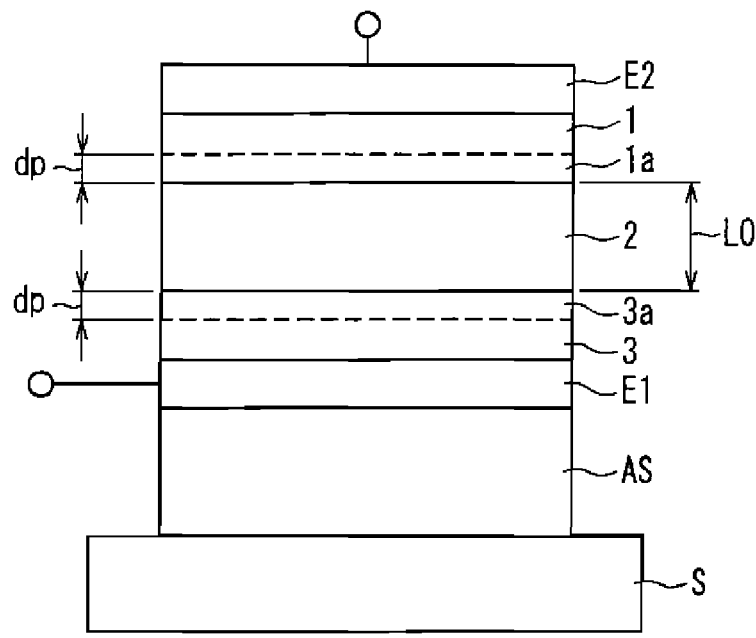
FIG. 17 is a front view showing a conventional frequency-variable acoustic thin film resonator.
Figure 18:
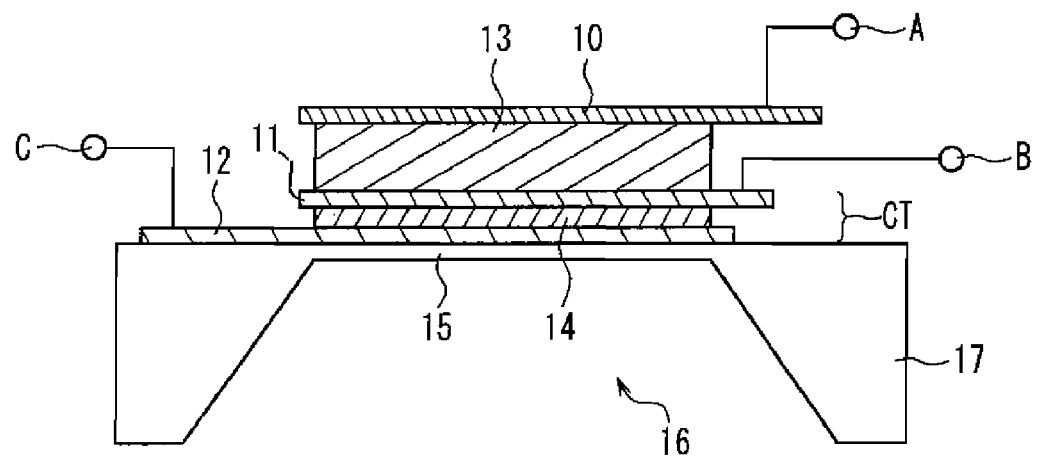
FIG. 18 is a cross-sectional view showing another conventional frequency-variable acoustic thin film resonator.
Figure 19A:
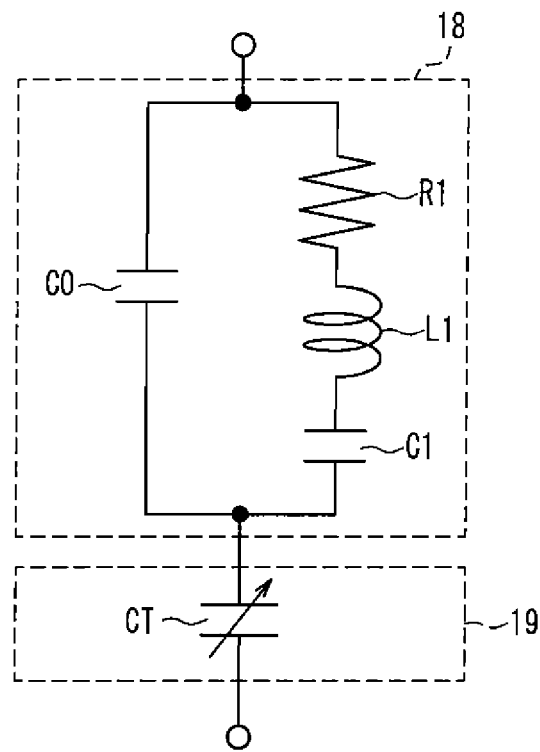
FIG. 19A is a diagram showing an equivalent circuit of the frequency-variable acoustic thin film resonator shown in FIG. 18.
Figure 19B:
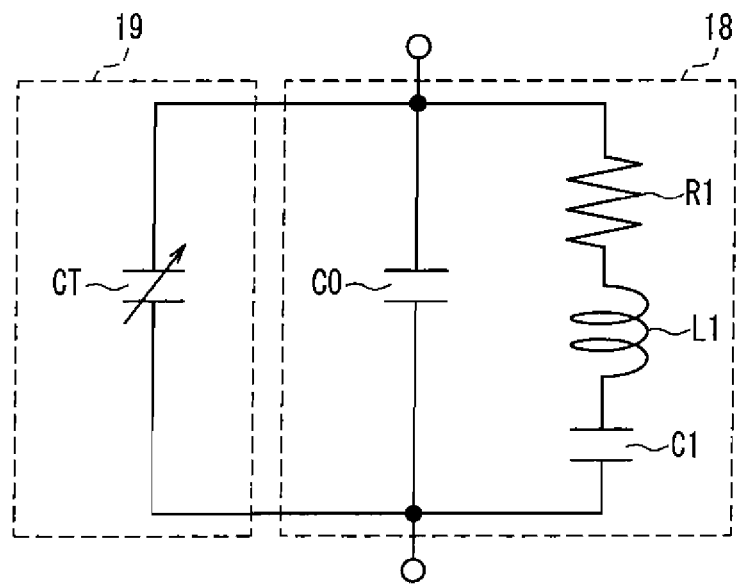
FIG. 19B is a diagram showing an equivalent circuit of the frequency-variable acoustic thin film resonator shown in FIG. 18 as another example.

FIG. 16 is a block diagram showing a configuration of a communication apparatus according to Embodiment 7. This apparatus has a configuration in which a signal received by an antenna 601 is supplied to a low-noise amplifier (LNA) 603 via a duplexer 602, and an output of the LNA 603 is inputted to a base band portion 604, and also a signal outputted from the base band portion 604 is amplified by a power amplifier (PA) 605 and then is transmitted from the antenna 601 via the duplexer 602. The duplexer 602 has a configuration similar to the configuration of the duplexer shown in Embodiment 6. According to this configuration, a compact and low-loss communication apparatus can be realized. Further, frequency change is performed so as to conform to communication systems, which allows a single filter to be adaptable to a plurality of communication systems, thereby providing a considerable effect from the viewpoint of usage.

The configurations disclosed in the above-described embodiments are to be considered illustrative in all respects and not restrictive. The technical scope of the present invention is defined by the claims and not by the descriptions of the above-described embodiments, and all changes that come within the meaning and range of equivalency of the claims are intended to be embraced within the scope.

INDUSTRIAL APPLICABILITY

The frequency-variable acoustic thin film resonator and filter of the present invention are suitable for applications in which desired frequency characteristics of admittance is such that a resonant frequency and an antiresonant frequency are variable, and can be used in mobile phones, for radio communication or wireless internet connection, and the like.

The invention claimed is:

1. A frequency-variable acoustic thin film resonator, comprising:
   a first piezoelectric thin film;
   a pair of primary electrodes for applying an electric signal, which are formed on the first piezoelectric thin film;
   a second piezoelectric thin film that is disposed so that an oscillation generated in the first piezoelectric thin film propagates to the second piezoelectric thin film;
   a pair of secondary electrodes for outputting an electric signal, which are formed on the second piezoelectric thin film;
   a load that is connected between the secondary electrodes; and
   a control portion that controls a value of the load,
   whereby an acoustic thin film resonator element is formed so that an electric signal inputted from the primary electrodes is outputted from the secondary electrodes by a piezoelectric effect, and
   a resonant frequency and an antiresonant frequency are made variable through the control of the value of the load,
   wherein the first piezoelectric thin film and the second piezoelectric thin film are disposed in a laminated state,
   between the first piezoelectric thin film and the second piezoelectric thin film, a second electrode is provided so as to be shared by both of the piezoelectric thin films,
   a first electrode is provided on a surface of the first piezoelectric thin film on a side opposite the second electrode,
   a third electrode is provided on a surface of the second piezoelectric thin film on a side opposite the second electrode,
   the first and second electrodes function as the primary electrodes,
   the second and third electrodes function as the secondary electrodes, and
   where a total of film thicknesses of the first and second electrodes and the first piezoelectric thin film is defined as a film thickness P, and a sum of the film thickness P and thicknesses of the second piezoelectric thin film and the third electrode is defined as an entire film thickness T, a film thickness ratio P/T is set to be in a range of values larger than a value at which a resonator element constituted of the first and second electrodes and the first piezoelectric film has a maximum effective coupling coefficient and smaller than a value at which a resonator element constituted of the second and third electrodes and the second piezoelectric film has a maximum effective coupling coefficient.

2. The frequency-variable acoustic thin film resonator according to claim 1,
   wherein the load is formed of a variable capacitance.

3. The frequency-variable acoustic thin film resonator according to claim 2,
   wherein the load is set to have a value variable in a range between 1/100 times and 100 times a value of a secondary capacitance that is defined as a capacitance between the pair of secondary electrodes of the acoustic thin film resonator element.

4. The frequency-variable acoustic thin film resonator according to claim 3,
   wherein the load is set to have a value variable in a range between 1/10 times and 10 times the value of the secondary capacitance of the acoustic thin film resonator element.

5. The frequency-variable acoustic thin film resonator according to claim 1,
wherein the load is formed of a variable inductor.

6. The frequency-variable acoustic thin film resonator according to claim 5,
wherein the variable inductor is set to have an impedance variable in a range between $1/100$ times and 100 times a value of a secondary impedance that is defined as an impedance between the pair of secondary electrodes of the acoustic thin film resonator element.

7. The frequency-variable acoustic thin film resonator according to claim 6,
wherein the variable inductor is set to have an impedance variable in a range between $1/10$ times and 10 times the value of the secondary impedance of the acoustic thin film resonator element.

8. The frequency-variable acoustic thin film resonator according to claim 1,
wherein the load is configured so as to be switched between infinity and zero by means of a switch element.

9. The frequency-variable acoustic thin film resonator according to claim 1,
wherein the load is formed of a plurality of switch elements and a plurality of loads that are switched between a connected state and a disconnected state by the plurality of switch elements, and values of the loads are made variable through switching of the switch elements.

10. The frequency-variable acoustic thin film resonator according to claim 1,
wherein the first piezoelectric thin film and the second piezoelectric thin film are made of AlN,
the first to third electrodes are made of Mo, and
where a film thickness ratio P/T is set to be in a range of 0.4 to 0.5.

11. The frequency-variable acoustic thin film resonator according to claim 1,
wherein the first piezoelectric thin film and the second piezoelectric thin film are made of AlN,
the first to third electrodes are made of Mo, and
where a film thickness ratio P/T is set to be not higher than 0.58.

12. A filter composed of one or a combination of the frequency-variable acoustic thin film resonators according to claim 1.

13. A duplexer comprising the filter according to claim 12.

14. A communication apparatus comprising the duplexer according to claim 13.

* * * * *